United States Patent
Dai et al.

(10) Patent No.: US 8,048,589 B2
(45) Date of Patent: Nov. 1, 2011

(54) PHASE SHIFT PHOTOMASK PERFORMANCE ASSURANCE METHOD

(75) Inventors: Yi-Ming Dai, Hsinchu (TW);
Chien-Hsing Wu, Jubei (TW);
Chi-Hung Liao, Sanchong (TW);
Li-Kong Turn, Hsin-chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 857 days.

(21) Appl. No.: 11/192,667

(22) Filed: Jul. 30, 2005

(65) Prior Publication Data

US 2007/0026320 A1    Feb. 1, 2007

(51) Int. Cl.
*G03F 1/00* (2006.01)
(52) U.S. Cl. ............................. 430/5; 430/311
(58) Field of Classification Search ........... 430/311, 430/5; 716/19, 21
See application file for complete search history.

(56) References Cited

U.S. PATENT DOCUMENTS

| | | | | |
|---|---|---|---|---|
| 5,783,337 | A * | 7/1998 | Tzu et al. | 430/5 |
| 7,250,309 | B2 * | 7/2007 | Mak et al. | 438/14 |
| 2002/0025480 | A1 * | 2/2002 | Itoh et al. | 430/5 |
| 2002/0150824 | A1 * | 10/2002 | Park | 430/5 |
| 2004/0086788 | A1 * | 5/2004 | Shiota et al. | 430/5 |
| 2004/0229137 | A1 * | 11/2004 | Takushima | 430/5 |
| 2005/0053850 | A1 * | 3/2005 | Askebjer et al. | 430/5 |
| 2005/0095510 | A1 * | 5/2005 | Yamamoto et al. | 430/5 |
| 2005/0112474 | A1 * | 5/2005 | Sandstrom | 430/5 |
| 2006/0099519 | A1 * | 5/2006 | Moriarty et al. | 430/5 |
| 2006/0134529 | A1 * | 6/2006 | Hansen | 430/5 |

* cited by examiner

*Primary Examiner* — Stephen Rosasco
*Assistant Examiner* — Rashid Alam
(74) *Attorney, Agent, or Firm* — Tung & Associates

(57) ABSTRACT

A method for inspecting a phase shift photomask employs a phase shift photomask having an active pattern region. An optical property of the phase shift photomask is measured within the active pattern region, rather than, for example, a non-active pattern border region. By making the measurement within the active pattern region, performance of the phase shift mask may be properly assured. The method is particularly useful for inspecting attenuated phase shift photomasks to assure absence of side-lobes when photoexposing blanket photoresist layers.

20 Claims, 2 Drawing Sheets

PHASE SHIFT PHOTOMASK PERFORMANCE ASSURANCE METHOD

BACKGROUND OF THE INVENTION

1. Field of the Invention

The invention relates generally to methods for assuring performance of photomasks employed for fabricating microelectronic products. More particularly, the invention relates to methods for assuring performance of phase shift photomasks employed for fabricating microelectronic products.

2. Description of the Related Art

Photolithographic processes and methods are integral to the fabrication of microelectronic products. They are employed for defining patterned photoresist mask layers that are employed within various microelectronic fabrication processes. The microelectronic fabrication processes may include, but are not limited to etch processes, deposition processes and ion implantation processes.

As microelectronic product feature dimensions have decreased, it has become increasingly difficult to form patterned photoresist layers with enhanced resolution while employing conventional photomasks and conventional actinic radiation sources. Phase shift photomask constructions have arisen as a result of the need for forming such patterned photoresist layers with enhanced resolution. Phase shift photomasks differ from conventional photomasks insofar as phase shift photomasks provide for a phase shifting of actinic radiation such as to provide a higher resolution (i.e., sharper) actinic radiation intensity peak transmitted through a phase shift photomask. In turn, this provides a correspondingly enhanced resolution of a patterned photoresist layer formed employing a phase shift photomask.

Various phase shift photomask constructions are known. A particularly common phase shift photomask construction is an attenuated phase shift photomask construction. It employs transparent areas of a transparent substrate that are separated by masked regions of the substrate formed from an incompletely opaque material layer. Typically, the incompletely opaque material layer has a transmittance on the order of several percent. The thickness of the incompletely opaque material layer is selected such as to provide for a phase shift of actinic radiation when employing the attenuated phase shift photomask.

While attenuated phase shift photomasks provide particular advantage when employed within photolithographic methods, they are nonetheless not entirely without problems. In that regard, it is particularly important when employing attenuated phase shift photomasks that a transmittance of an incompletely opaque material layer be within a generally narrow range. At a transmittance level below the narrow range, enhanced resolution of transmitted actinic radiation is not realized. At a transmittance level above the narrow range, a side lobe effect of the transmitted actinic radiation may occur. The side lobe effect yields an undesirable inhomogeneous photoexposure and development of a patterned photoresist layer.

Desirable are methods for assuring optimal performance of attenuated phase shift photomasks. The invention is directed towards the foregoing object.

SUMMARY OF THE INVENTION

A first object of the invention is to provide a method for assuring performance of a phase shift photomask.

A second object of the invention is to provide a method in accord with the first object of the invention, wherein the method assures optimal performance of the phase shift photomask.

In accord with the objects of the invention, the invention in a first instance provides a method for inspecting a phase shift photomask. The method provides that an optical property of a phase shift photomask is measured in an active pattern region of the phase shift photomask. The invention is particularly applicable to an attenuated phase shift photomask, where a transmittance of an incompletely opaque material layer is measured within the active pattern region. To provide optimal performance of the method, the active pattern region is designed and measured within the context of specific geometric limitations.

The invention provides a method for assuring optimal performance of a phase shift photomask.

The invention realizes the foregoing object by providing that an optical property of a phase shift photomask is measured in an active pattern region of the phase shift photomask. The optical property is measured in the active pattern region rather than, for example, a non-active pattern border region of the phase shift photomask.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The invention provides a method for assuring optimal performance of a phase shift photomask.

The invention realizes the foregoing object by providing that an optical property of a phase shift photomask is measured in an active pattern region of the phase shift photomask rather than, for example, a non-active pattern border region of the phase shift photomask.

The preferred embodiment of the invention illustrates the invention within the context of measuring a transmittance of an incompletely opaque material layer within an attenuated phase shift photomask. However, the invention is not intended to be so limited. Rather, in a broad embodiment, the invention may be employed within the context of assuring performance of phase shift photomasks including but not limited to attenuated phase shift photomasks and phase shift photomasks other than attenuated phase shift photomasks. Such other phase shift photomasks may include, but are not limited to alternating phase shift photomasks. Within a broad embodiment of the invention, an optical property measured within an active pattern region of a phase shift photomask to assure performance thereof may include, but is not limited to an optical transmittance, an optical absorbance or an optical phase shift.

Figure 1:
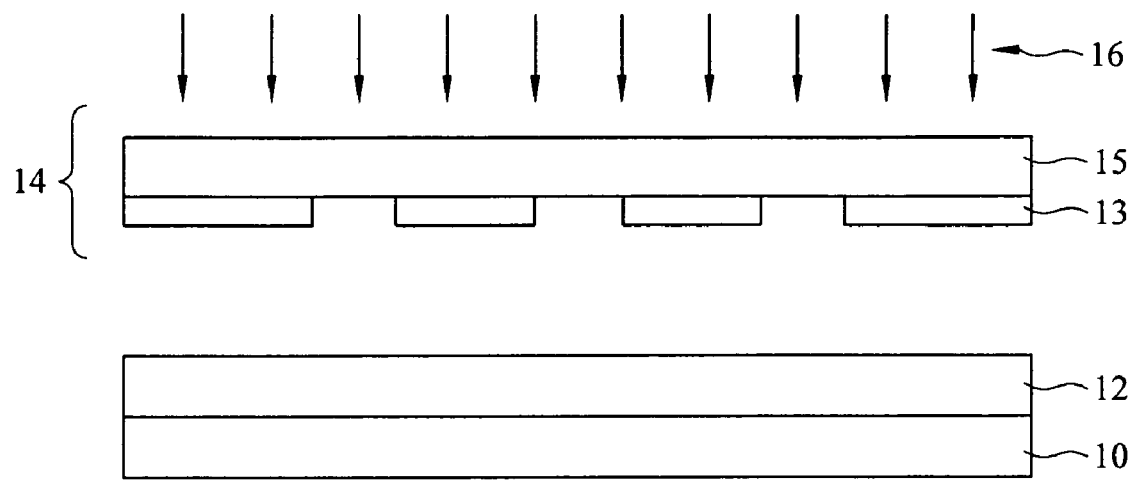
FIG. 1 shows a schematic cross-sectional diagram illustrating photoexposure of a photoresist layer upon a substrate with an attenuated phase shift mask in accord with the invention.

FIG. 1 shows a schematic cross-sectional diagram illustrating use of an attenuated phase shift photomask for purposes of photoexposing a blanket photoresist layer formed upon a substrate in accord with a preferred embodiment of the invention.

FIG. 1 shows a substrate 10. A blanket photoresist layer 12 is formed upon the substrate 10.

The substrate 10 may be formed from any of several materials as are employed when fabricating microelectronic products. The materials may include, but are not limited to conductor materials, semiconductor materials and dielectric materials. Typically, the substrate 10 comprises a semiconductor substrate.

The blanket photoresist layer 12 may be formed of positive photoresist materials or negative photoresist materials. However, the invention provides particular value under circumstances where the blanket photoresist layer 12 is formed of a positive photoresist material.

FIG. 1 also shows an attenuated phase shift photomask 14 registered with respect to the substrate 10. The attenuated phase shift photomask 14 comprises a transparent substrate 15. A series of incompletely opaque material layers 13 is formed upon the transparent substrate 15. The transparent substrate 15 is typically a quartz substrate formed to a thickness of from about 1 to about 3 millimeters. The series of incompletely opaque material layers 13 may be formed from any of several incompletely opaque materials as are conventional for forming attenuated phase shift photomasks. Such incompletely opaque materials may be selected from the group consisting of metals and metal oxides. The series of incompletely opaque material layers 13 is formed to a thickness such as to provide a phase shifting of transmitted actinic radiation when employing the attenuated phase shift mask 14 for photoexposing the blanket photoresist layer 12.

Finally, FIG. 1 shows a dose of actinic radiation 16 that is employed in photoexposing the blanket photoresist layer 12. The dose of actinic radiation 16 may be from any of several wavelengths as are conventional in the microelectronic product fabrication art.

Within FIG. 1, the dose of actinic radiation 16 when passing through the incompletely opaque material layers 13 provides for an enhanced resolution of transmitted actinic radiation. This is further illustrated in FIG. 2.

Figure 2:
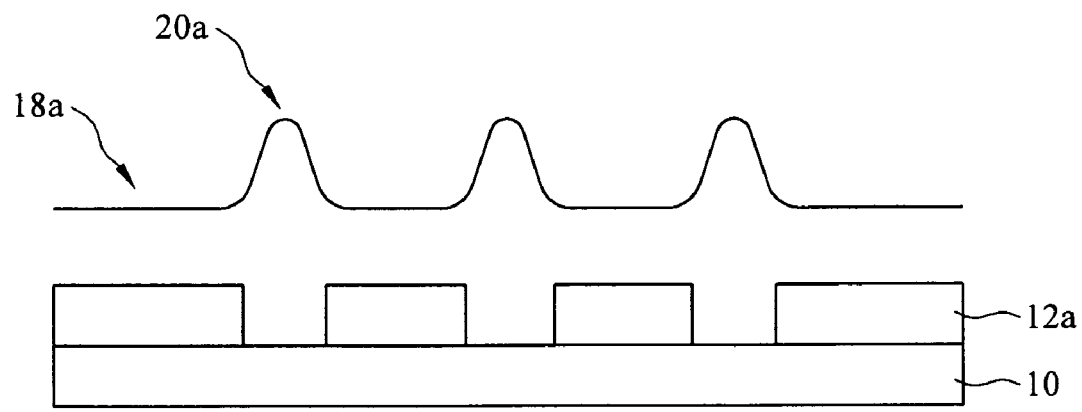
FIG. 2 shows a schematic cross-sectional diagram of a photoexposed and developed patterned photoresist layer absent side-lobe irradiation.

FIG. 2 shows a series of patterned photoresist layers 12*a* formed upon the substrate 10. They are formed incident to photoexposure and development of the blanket photoresist layer 12. Each of the series of patterned photoresist layers 12*a* is formed well defined with a flat top and with straight sidewalls. Curve 18*a* within FIG. 2 illustrates actinic radiation intensity transmitted through the phase shift photomask 14 as illustrated in FIG. 1. The actinic radiation intensity is well defined with sharp high resolution main peaks 20*a* that in turn lead to the well defined high resolution patterned photoresist layers 12*a*. The actinic radiation intensity 18*a* with such high resolution sharply defined curvature typically results when employing an incompletely opaque material layer 13 of transmittance of from about 4.0 to about 6.3 percent.

Figure 3:
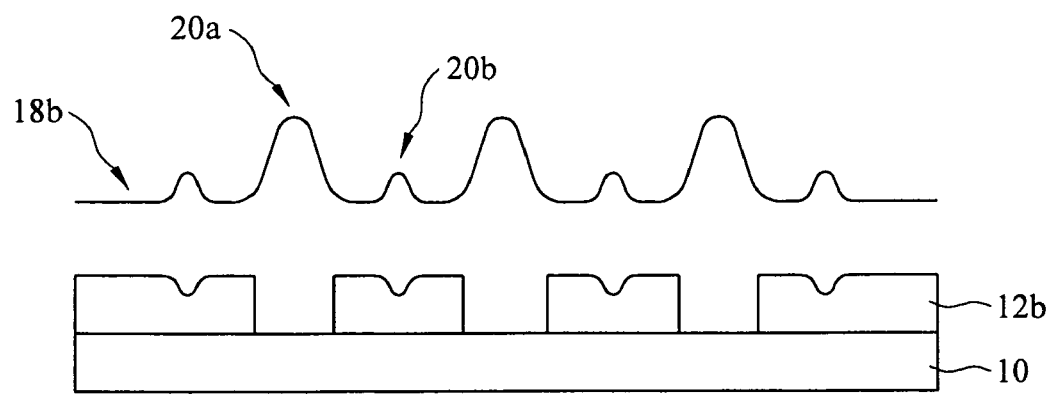
FIG. 3 shows a schematic cross-sectional diagram of a photoexposed and developed patterned photoresist layer with side-lobe irradiation.

For comparison purposes, FIG. 3 shows a series of patterned photoresist layers 12*b* formed upon the substrate 10. They are also formed incident to actinic irradiation through the attenuated phase shift photomask 14 of FIG. 1. However, within FIG. 3 a transmitted actinic radiation curve 18*b* is predicated upon an incompletely opaque material layer 13 transmittance of greater than about 6.3 percent. Thus the transmitted actinic radiation curve 18*b* exhibits a series of side lobes 20*b* in addition to the series of main peaks 20*a* as illustrated within the transmitted actinic radiation curve 18*a* within FIG. 2. The series of side lobes 20*b* provides for an additional photoexposure and development of portions of the blanket photoresist layer 12 beneath the series of incompletely opaque material layers 13. This provides a series of indented tops within the series of patterned photoresist layers 12*b* in comparison with the series of patterned photoresist layers 12*a*. The indented tops may provide inadequate protection when further processing the substrate 10 when employing the series of patterned photoresist layers 12*b* as a mask.

The invention is directed towards providing a method for assuring optimal performance of a phase shift photomask such as to avoid side lobes within an actinic radiation curve. This in turn will provide a patterned photoresist layer with enhanced resolution absent indented tops.

The invention primarily realizes the foregoing object by measuring an optical property of a phase shift photomask within an active pattern region of the phase shift photomask. The optical property is measured within the active pattern region, for example, in comparison with a non-active pattern border region of a phase shift mask where it is not measured. The method further employs the optical property measurement for purposes of disqualifying the phase shift photomask from use, thus assuring optimal performance of the phase shift photomask.

Figure 4:
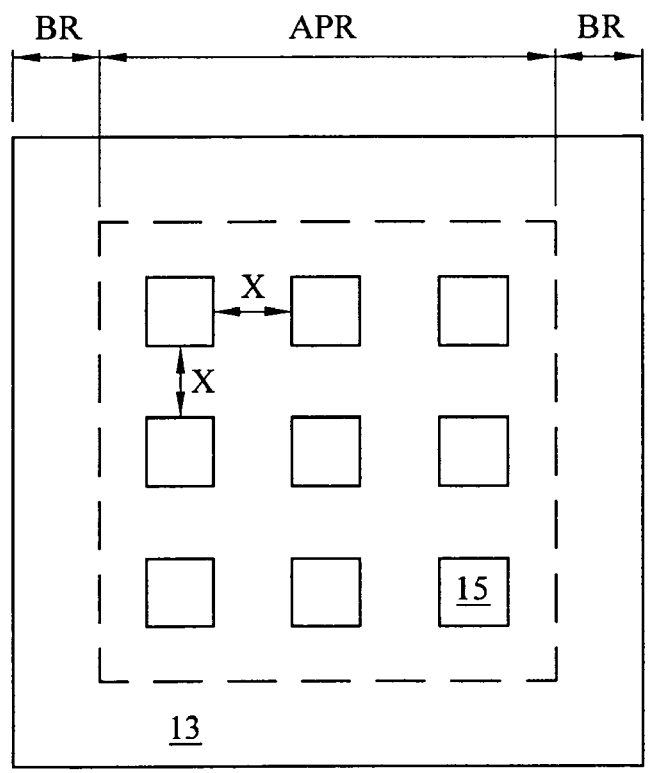
FIG. 4 shows a schematic plan-view diagram illustrating an active pattern region of a phase shift mask that may be inspected in accord with the invention.

FIG. 4 shows a schematic plan-view diagram of an attenuated phase shift photomask that may be inspected in accord with the present invention. FIG. 4 shows an incompletely opaque material layer 13 having formed therein several apertures that leave exposed a series of portions of the transparent substrate 15. FIG. 4 also shows an active pattern region APR that contains the several apertures, and a border region BR of the attenuated phase shift photomask that does not.

The invention employs a minimum of a 3×3 array of apertures within the attenuated phase shift photomask. The apertures are separated in a horizontal direction and in a vertical direction by an equal distance X. The invention further contemplates definition of a design ratio requirement DR for inspecting an active pattern region of an attenuated phase shift photomask. The design ratio provides that: (1) the separation distance between apertures X; minus (2) 2 times a measurement tooling registration tolerance 2RT; divided by (3) a minimum linewidth phase shift photomask design rule MDR, falls within a specified range (i.e., DR=((X−2RT)/MDR)). The specified range is preferably 1.17 to 1.8. The invention further provides for obtaining a minimum of 5 measurements at a minimum of 5 separated measurement locations within the minimum of 3×3 array. An attenuated phase shift mask is determined to be qualified for use in a photolithographic process if each of the 5 measurements has a transmittance of at least less than 6.3 percent and preferably also greater than 4.0 percent. Absent conformance with the foregoing upper limit requirement, the attenuated phase shift mask is not employed when photoexposing a blanket photoresist layer, since a side-lobing effect is expected.

With respect to definition of measurement locations within a minimum of 3×3 array within an attenuated phase shift mask, they may be defined employing a direct write database, such as a direct write electron beam database. The direct write database preferably derives from data initially employed for direct write electron beam exposure when fabricating the phase shift photomask. Individual measurement locations may be measured while employing an appropriate measurement apparatus. Aerial image measurement systems are commonly available for measurement of transmittance or absorbance. Phase angle measurement apparatus are also available for measurement of phase angles.

The preferred embodiment of the invention is illustrative of the invention rather than limiting of the invention. Revisions and modifications may be made to methods, materials, structures and dimensions in accord with the preferred embodiment of the invention while still providing an embodiment in accord with the invention, further in accord with the accompanying claims.

What is claimed is:

1. A method for inspecting a phase shift photomask to qualify or disqualify said photomask from use in a photolithography process comprising:
    providing a phase shift photomask having an active pattern region;
    measuring within the active pattern region an optical property of the phase shift photomask including measuring a transmittance value of radiation transmitted through a patterned ordered array comprising said active pattern region while excluding from said measuring an immediately adjacent incompletely opaque non-active pattern border region of the phase shift photomask to qualify or disqualify said photomask for use in a photolithography process; said ordered array comprises an array of a minimum dimension of 3×3 transparent regions defined within said incompletely opaque material layer; and,
    disqualifying said photomask from use in said photolithography process if said optical property is not within an acceptable range, said acceptable range having the effect of avoiding transmitted radiation sidelobes through said phase shift mask in a photoexposure process comprising said photolithography process.

2. The method of claim 1 wherein the phase shift photomask is an attenuated phase shift photomask.

3. The method of claim 1 wherein the phase shift photomask is an alternating phase shift photomask.

4. The method of claim 1 wherein the optical property includes a percent transmittance of an incompletely opaque material layer within the active pattern region.

5. The method of claim 1 wherein the optical property includes a phase angle of a radiation beam transmitted through the phase shift photomask within the active pattern region.

6. A method for photoexposing a blanket photoresist layer while employing a phase shift photomask following qualification of said photomask for use in a photolithography process comprising:
    providing a phase shift photomask having an active pattern region;
    measuring within the active pattern region an optical property of the phase shift mask including measuring a transmittance value of radiation transmitted through a patterned ordered array comprising said active pattern region while excluding from said measuring an immediately adjacent incompletely opaque non-active pattern border region of the phase shift mask, wherein said ordered array comprises an array of a minimum dimension of 3×3 transparent regions defined within an incompletely opaque material layer, a distance between said transparent regions substantially equal in a vertical and horizontal direction;
    assuring the optical property is within a specified range, said specified range having the effect of avoiding transmitted radiation sidelobes through said phase shift mask in a photoexposure process comprising said photolithography process; and
    employing the phase shift photomask for photoexposing a blanket photoresist layer formed upon a substrate only if the optical property is within the specified range.

7. The method of claim 6 wherein the phase shift photomask is an attenuated phase shift photomask.

8. The method of claim 6 wherein the phase shift photomask is an alternating phase shift photomask.

9. The method of claim 6 wherein the optical property includes a percent transmittance comprising an incompletely opaque material layer within the active pattern region.

10. The method of claim 6 wherein the optical property includes a phase angle of a radiation beam transmitted through the phase shift photomask within the active pattern region.

11. A method for inspecting an attenuated phase shift photomask to qualify or disqualify said photomask from use in a photolithography process comprising:
    providing an attenuated phase shift photomask having an ordered array active pattern region;
    measuring within the ordered array active pattern region an optical property of the phase shift photomask including measuring a transmittance value of radiation transmitted through a patterned ordered array comprising said active pattern region while, excluding from said measuring an immediately adjacent incompletely opaque non-active pattern border region of the phase shift mask to qualify or disqualify said photomask for use in a photolithography process; wherein the ordered array active pattern region comprises said ordered array of minimum dimensions of 3×3 transparent regions defined within said incompletely opaque material layer; and,
    disqualifying said photomask from use in said photolithography process if said optical property is not within an acceptable range, said acceptable range having the effect of avoiding transmitted radiation sidelobes through said phase shift mask in a photoexposure process comprising said photolithography process.

12. The method of claim 11 wherein the optical property includes a percent transmittance of an incompletely opaque material layer within the active pattern region.

13. The method of claim 11 wherein an equal separation distance in both aerial dimensions separates the transparent regions.

14. The method of claim 13 wherein the ordered array active pattern region is designed within the context of a design ratio of from about 1.17 to about 1.8, where:

design ratio=$(X-(2RT))/MDR$, and where:

X=the equal separation distance;
RT=a measurement tooling registration tolerance; and
MDR=a minimum design rule for phase shift photomask features.

15. The method of claim 14 wherein a minimum of 5 separated measurements is obtained within separated locations of the incompletely opaque material layer within the ordered array.

16. The method of claim 15 wherein an attenuated phase shift photomask is deemed unqualified for photoexposing a blanket photoresist layer if any of the minimum of five separated measurements has a transmittance of greater than 6.3 percent.

17. The method of claim 16 wherein the minimum of 5 separated measurements is obtained employing an aerial image measurement system.

18. The method of claim 1 wherein the optical property includes a percent transmittance of an incompletely opaque material layer within the active pattern region, wherein said photomask is deemed unqualified for photoexposing a photoresist layer wherein said percent transmittance is greater than about 6.3 percent.

19. The method of claim 6 wherein the optical property includes a percent transmittance of an incompletely opaque material layer within the active pattern region, wherein said photomask is deemed unqualified for photoexposing a photoresist layer if said percent transmittance is greater than about 6.3 percent.

20. A method for inspecting an attenuated phase shift photomask to qualify or disqualify said photomask from use in a photolithography process comprising:

provicing an attenuated phase shift photomask having an ordered array active pattern region;

measuring within the ordered array active pattern region an optical property of the phase shift photomask by measuring radiation transmitted through a patterned ordered array comprising said active pattern region while excluding said measuring from a non-active pattern border region of the phase shift mask to qualify or disqualify said photomask for use in a photolithography process; and, disqualifying said photomask from use in said photolithography process if said optical property is not within an acceptable range, said acceptable range having the effect of avoiding transmitted radiation sidelobes through said phase shift mask in a photoexposure process comprising said photolithography process;

wherein the ordered array active pattern region comprises said ordered array of minimum dimensions of 3×3 transparent regions defined within an incompletely opaque material layer and wherein an equal separation distance in both aerial dimensions separates the transparent regions; and wherein the ordered array active pattern region is designed within the context of a design ratio of from about 1.17 to about 1.8, where:

design ratio=$(X-(2RT))/MDR$, and where:

$X$=the equal separation distance;
$RT$=a measurement tooling registration tolerance; and
$MDR$=a minimum design rule for phase shift photomask features.

* * * * *